United States Patent [19]
Shirakawa

[11] Patent Number: 5,628,061
[45] Date of Patent: May 6, 1997

[54] SYNTHESIZER RECEIVER

[75] Inventor: Hiroshi Shirakawa, Tokyo, Japan

[73] Assignee: Sony Corporation, Tokyo, Japan

[21] Appl. No.: 373,668

[22] Filed: Jan. 17, 1995

[30] Foreign Application Priority Data

Jan. 24, 1994 [JP] Japan .................... PO-023323

[51] Int. Cl.$^6$ .................................................. H04B 17/00
[52] U.S. Cl. .................... 455/186.1; 455/161.1; 455/181.1; 455/185.1
[58] Field of Search ............... 455/37.1, 150.1, 455/171.1, 181.1, 186.1, 145, 231, 161.1, 180.3, 190.1, 186.2, 33.1, 185.1, 179.1; 368/21, 47

[56] References Cited

U.S. PATENT DOCUMENTS

| | | | |
|---|---|---|---|
| 4,403,344 | 9/1983 | Yomada et al. | 455/181.1 |
| 4,987,605 | 1/1991 | Nose | 455/161 |
| 5,007,033 | 4/1991 | Kubota et al. | 368/21 |
| 5,008,955 | 4/1991 | Sato | 455/181.1 |
| 5,101,508 | 3/1992 | Owaki | 455/186.1 |
| 5,140,589 | 8/1992 | Otsuka | 455/231 |
| 5,258,964 | 11/1993 | Koma et al. | 455/181.1 |

FOREIGN PATENT DOCUMENTS

90/13983  11/1990  WIPO.

OTHER PUBLICATIONS

IEEE Transactions on Consumer Electronics, Aug. 1981 Tanaka et al. "New Digital Synthesizer LSI for FM/AM Receivers".
IEEE Transactions on Consumer Electronics, Aug. 1980, Ichinose et al., "One Chip AM/FM Digital Tuning System".

*Primary Examiner*—Reinhard J. Eisenzopf
*Assistant Examiner*—Gertrude Arthur
*Attorney, Agent, or Firm*—Jay H. Maioli

[57] ABSTRACT

A synthesizer radio receiver having a tuner for tuning in reception frequencies, a storage memory for storing location data and time difference and frequency interval data associated with the location data, an input device for inputting control data, a controller for controlling the tuner in accordance with frequency interval data stored in the storage memory, and a display device for displaying time information.

11 Claims, 6 Drawing Sheets

| AREA NUMBER ARNO | TIME DIFFERENCE DATA TMDF | PLACE NAME DATA PLCDT | AREA ETC. | FREQUENCY INTERVAL |
|---|---|---|---|---|
| 0 | ± 0 | LONDON | LONDON, LISBON | |
| 1 | ± 1 | C.EURO | CENTRAL EUROPE | |
| 2 | + 2 | CAIRO | CAIRO, ATHENS | |
| 3 | + 3 | JEDDA | JEDDA, NAIROBI | |
| ⋮ | | | | 9kHz |
| 9 | + 9 | TOKYO | TOKYO, SEOUL | |
| ⋮ | | | | |
| 12 | +12 | AUKLND | AUKLAND, FIJI | |
| 13 | −11 | SAMOA | SAMOA | |
| 14 | −10 | HAWAII | HAWAII, TAHITI | |
| 15 | − 9 | ANCHRG | ANCHORAGE | |
| ⋮ | | | | 10kHz |
| 21 | − 3 | RIO | RIO DE JANEIRO | |
| 22 | − 2 | FN.ISL | FERNAND DE NORONHA | 9kHz |
| 23 | − 1 | AZORES | THE AZORES | |

TDTBL
TIME DIFFERENCE TABLE

FIG. 2

| AREA NUMBER ARNO | TIME DIFFERENCE DATA TMDF | PLACE NAME DATA PLCDT | AREA ETC. | FREQUENCY INTERVAL |
|---|---|---|---|---|
| 0 | ± 0 | LONDON | LONDON, LISBON | 9 kHz |
| 1 | ± 1 | C.EURO | CENTRAL EUROPE | |
| 2 | + 2 | CAIRO | CAIRO, ATHENS | |
| 3 | + 3 | JEDDA | JEDDA, NAIROBI | |
| ⋮ | | | | |
| 9 | + 9 | TOKYO | TOKYO, SEOUL | |
| ⋮ | | | | |
| 12 | +12 | AUKLND | AUKLAND, FIJI | |
| 13 | −11 | SAMOA | SAMOA | |
| 14 | −10 | HAWAII | HAWAII, TAHITI | 10 kHz |
| 15 | − 9 | ANCHRG | ANCHORAGE | |
| ⋮ | | | | |
| 21 | − 3 | RIO | RIO DE JANEIRO | |
| 22 | − 2 | FN.ISL | FERNAND DE NORONHA | 9 kHz |
| 23 | − 1 | AZORES | THE AZORES | |

TDTBL
TIME DIFFERENCE TABLE

SYNTHESIZER RECEIVER

FIELD OF THE INVENTION

The present invention relates to a synthesizer radio receiver suitable for use in various areas of the world. More particularly, the present invention is directed to a synthesizer radio receiver capable of receiving broadcast frequencies at either of two or more predetermined frequency intervals.

BACKGROUND OF THE INVENTION

The frequency interval, or step, between medium frequency broadcasts is 9 kHz in Japan and many other countries. However, it is 10 kHz in some countries such as, for example, the USA (in communities such as Hawaii, Los Angeles, etc.) and its neighboring countries (in communities such as Rio de Janeiro etc. ).

This causes no problem if a receiver uses a variable capacitor for tuning in the broadcast signal, because the receiving frequency can be varied continuously by manual operation. However, in a synthesizer receiver, the interval between receiving frequencies is not continuous and is in fact typically fixed at either 9 kHz or 10 kHz. In other words, the synthesizer receiver is able to tune in frequencies at either 9 kHz intervals or 10 kHz intervals from each other. Therefore, if a person who visits various countries on overseas trips carries a synthesizer receiver, he/she will typically need to switch the interval between receiving frequencies for each area of his visit in order to receive broadcast radio signals in that particular country/region/area.

However, the operation of switching the frequency interval is cumbersome, or difficult, for ordinary users. A user may not even know whether the frequency interval between broadcast waves in an area of concern is 9 kHz or 10 kHz. Often, a switch for the frequency interval selection is located at a position on the receiver, such as inside a battery accommodating portion, which prevents unintentional switching. This makes an operation of switching the frequency interval further cumbersome or difficult.

Further, in shipping synthesizer receivers capable of receiving broadcast signals at more than one frequency interval, a maker typically needs to set the frequency interval at 9 kHz or 10 kHz depending upon their intended destination. This increases the number of assembly steps, and provides room for a mistake in the setting to occur during the assembly process. The present invention is directed to solving the above problems.

In the case of medium frequency broadcasts, such as AM+FM broadcasts the service area of a particular broadcast signal is typically more limited in contrast to short wave broadcasts. A receiver is typically not required, nor designed, to be able to receive a medium frequency broadcast transmitted from a relatively distant place. As a result medium frequency broadcasts from countries/regions/areas outside of the country/region/area in which the the receiver is located are not typically expected to be received by the receiver. Thus there is typically no problem presented if a receiver can not receive a medium frequency broadcast transmitted from another country/region/area. Conversely, there occurs no problem even if in other countries (for example; Japan, France, Germany, England or Italy) a receiver cannot receive a medium frequency broadcast transmitted from the USA or any of its neighboring countries.

As described above, the frequency interval between medium frequency broadcasts in the USA and its neighboring countries is different from that of many other countries. That is, the frequency interval of 10 kHz used in the USA is generally limited to a specific area within North America and South America, while most other areas outside of North and South America utilize a frequency interval between medium frequency broadcast of 9 kHz.

On the other hand, in general, synthesizer receivers carried by persons to overseas locations often not only can receive short wave broadcasts but also short wave broadcast signals. Further, these types of common synthesizer receivers often incorporate a clock circuit so as to be able to display the time of a destination place (local standard time) and the UTC time (coordinated universal time, Greenwich time) or some other predetermined reference time.

SUMMARY OF THE INVENTION

In view of the above facts, the present invention is directed to enabling automatic switching of the interval of receiving frequencies of radio broadcast signals based on a time difference between a reference time and the local time at a visited country/region/area, or the like.

The present invention is a synthesizer radio receiver which includes a tuner for receiving broadcast signals transmitted over reception frequencies separated by a predetermined frequency interval, a clock for maintaining a reference time, a display for displaying time information, a storage memory for storing location data and frequency interval and time difference data associated with the location data. It also includes an input device for inputting control data and a controller for controlling the tuner in accordance with frequency interval data stored in the storage memory and the control data input from the input device.

The invention is summarized as follows in which respective components are given reference symbols that will be used to describe an embodiment in the following text.

A received signal, or broadcast signal, is frequency-converted based on an output signal of a PLL, and a receiving frequency is changed by changing a frequency dividing ratio of a variable frequency dividing circuit of the PLL. To display current time, a clock circuit and a display for displaying time kept by the clock circuit are provided. A table, or data table, including data of names of countries/regions/areas and data of time differences between the named country/region/area and some predetermined reference time is provided. The local time, or time at a particular named country/region/area may be displayed on the display by referring to time difference data stored in the table and adjusting, or correcting, the time maintained by the clock circuit. The frequency interval of the synthesizer receiver is set to an interval appropriate for the locale, or particular named, or selected, country/region/area by varying the amount of the frequency dividing ratio of the PLL in accordance with frequency interval data stored in said table and associated with the particular named/selected country/region/area.

The present invention includes synthesizer receiver having a clock circuit, a display for displaying time, and a PLL in which a receiving frequency is converted based on an output signal of the PLL. The receiving frequency is converted by changing a frequency dividing ratio N of a variable frequency dividing circuit of the PLL in accordance with frequency interval data in a data table (TDTBL) stored in memory. The data table TDTBL includes data of respective names of areas, countries, or regions and corresponding time differences between the respective named/selected country/region/area and some predetermined reference time maintained by the clock circuit.

While travelling, a user inputs information dennoting the present locale or country/region/area. The time displayed on the display is corrected, or changed, in accordance with data stored in the data table TDTBL, and a variation amount of the frequency dividing ratio N of the PLL is set in accordance with a frequency interval of broadcast signals in the area corresponding to the time displayed on a display by referring to the data table.

When the time difference of the displayed local time is corrected for an area in which the receiver is used, the interval of receiving frequencies is corrected to 9 kHz or 10 kHz in accordance with frequency interval data stored in the data table TDTBL and associated with the corrected time difference.

BRIEF DESCRIPTION OF THE DRAWINGS

FIG. 2 shows an example of a data table;

DETAILED DESCRIPTION OF THE INVENTION

Figure 1:
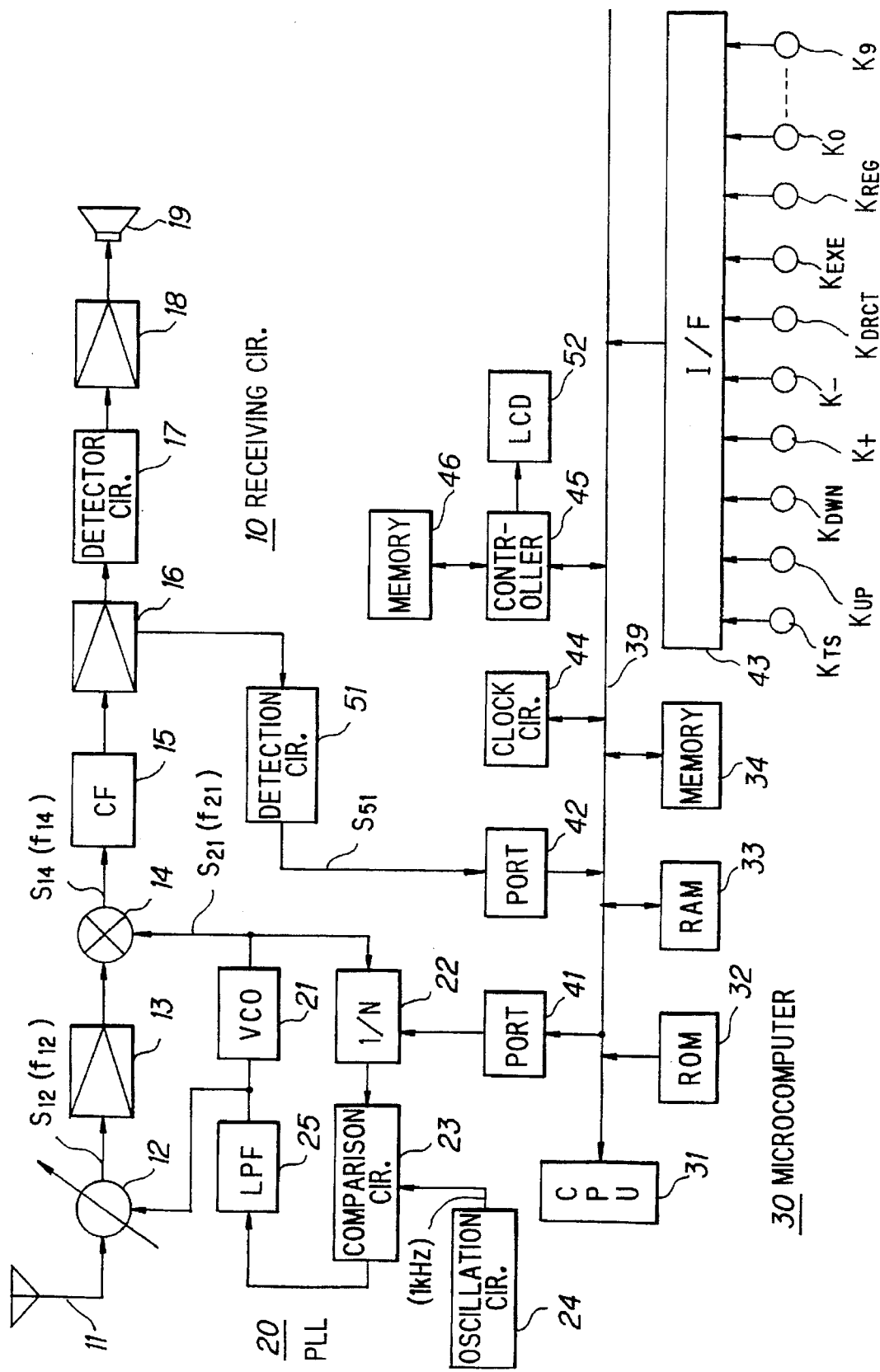
FIG. 1 is a system diagram showing an embodiment of the present invention.

FIG. 1 shows a synthesizer receiver which can receive both medium frequency broadcasts and short wave broadcasts, and in which a receiving band of medium frequency broadcasts is 531 kHz to 1,620 kHz (in 9 kHz steps) or 530 kHz to 1,620 kHz (in 10 kHz steps) and that of short wave broadcasts is 1,621 kHz to 30 MHz (in 1 kHz steps). In the following description, the term "time difference" means that with respect to the UTC time. It should be recognized however, that any other predetermined time may be used as a reference time.

In FIG. 1, reference numeral 10 denotes a receiving circuit. A receiving signal from an antenna 11 is supplied to an electronic tuning type antenna tuning circuit 12, which extracts an AM broadcast wave signal S12 of an intended frequency f12.

The signal S12 is supplied to a mixer circuit 14 via a high-frequency amplifier 13. An oscillation signal S21 of a frequency f21 is output from a VCO 21, which frequency f21 is, for instance, $$f21 = f12 + f14 \text{[kHz]} \qquad (1)$$

where f14 is an intermediate frequency of 450 kHz, for instance. Receiving the signal S21 as a local oscillation signal, the mixer circuit 14 frequency-converts the signal S12 to an intermediate frequency signal S14 (intermediate frequency f14) .

The intermediate frequency signal S14 is supplied to an AM detector circuit 17 via an intermediate frequency filter such as a ceramic filter 15 and an amplifier 16. An audio signal demodulated by the AM detector circuit 17 is supplied to a speaker 19 via an amplifier 18. A detection circuit 51, which is connected to the amplifier 16, produces a reception detecting signal S51 that indicates whether the receiving level of the receiving signal S12 is larger than a prescribed value.

The VCO 21 constitutes, together with circuits 22–25, a PLL 20. More specifically, the signal S21 output from the VCO 21 is supplied to a variable frequency dividing circuit 22, where the frequency is divided into 1/N. A frequency-divided signal is input to a phase comparison circuit 23. An oscillation signal having a reference frequency of, for instance, 1 kHz is output from an oscillation circuit 24, and also supplied to the phase comparison circuit 23. A comparison output of the phase comparison circuit 23 is passed through a low-pass filter 25, and supplied to the VCO 21 as its control voltage. The output voltage of the filter 25 is also supplied to the tuning circuit 12 as a station selecting voltage.

In a steady state, since the frequency-divided signal from the frequency dividing circuit 22 and the oscillation signal from the oscillation circuit have the same frequency, the frequency f21 of the oscillation signal S21 is $$f21 = N \times 1 \text{[kHz]} \qquad (2)$$

From Equations (1) and (2), $$f12 = f21 - f14$$
$$= N - 450 \text{ [kHz]}.$$

Therefore, if the dividing ratio N is varied at a step of 9 between 981 and 2,070, the local oscillation frequency f21 varies at a step of 9 kHz between 981 to 2,070 kHz. As a result, the receiving frequency f12 varies at a frequency step of 9 kHz over a frequency band of 531 to 1,620 kHz in accordance with the dividing ratio N.

If the dividing ratio N is varied at a step of 10 between 980 kHz and 2,070 kHz, the local oscillation frequency f21 varies at a step of 10 kHz between 980 kHz to 2,070 kHz. As a result, the receiving frequency f12 varies at a frequency step of 10 kHz over a frequency band of 530 kHz to 1,620 kHz in accordance with the dividing ratio N.

Similarly, if the dividing ratio N is varied at a step of 1 between 2,071 kHz to 30,450 kHz, the receiving frequency varies at a frequency step of 1 kHz over a frequency band of 1,621 kHz to 30 MHz.

Further, reference numeral 30 denotes a microcomputer for system control; 31, its CPU; 32, a ROM in which various processing routines are stored; 33, a RAM serving as a working area; and 34, a memory for storing various data. The memories 32–34 are connected to the CPU 31 via a system bus 39.

A time difference table TDTBL as shown in FIG. 2 is prepared and stored in the ROM 32. The time difference table TDTBL is a correspondence table between names of typical areas and time differences thereof. Therefore, the table TDTBL 24 data rows for respective time differences at intervals of 1 hour, and the respective data rows are assigned area numbers ARNO of 0 to 23. The respective rows of area numbers 0 to 12 are given time difference data TMDF indicating time differences of 0 to +12 hours, and the respective rows of area numbers 13 to 23 are given time difference data TMDF indicating time differences of −11 to −1 hour. Further, the respective rows of area numbers 0 to 23 are given place name data PLCDT each indicating a typical place name corresponding to the time difference of the row.

For example, in the case of the row of ARNO=9, TMDF= +9 and PLCDT=TOKYO. This means that the area of area number 9 has a time difference of +9 hours from the UTC or other predetermined reference time(time difference data TMDF) and a place name TOKYO (place name data PLCDT).

Two columns on the right side of the table TDTBL, i.e., "area etc." and "frequency interval" show, for reference, names of areas corresponding to each set of data ARNO, TMDF and PLCDT, and an interval of receiving frequencies in that area, respectively. These columns are not included in the time difference table TDTBL.

Figure 3:
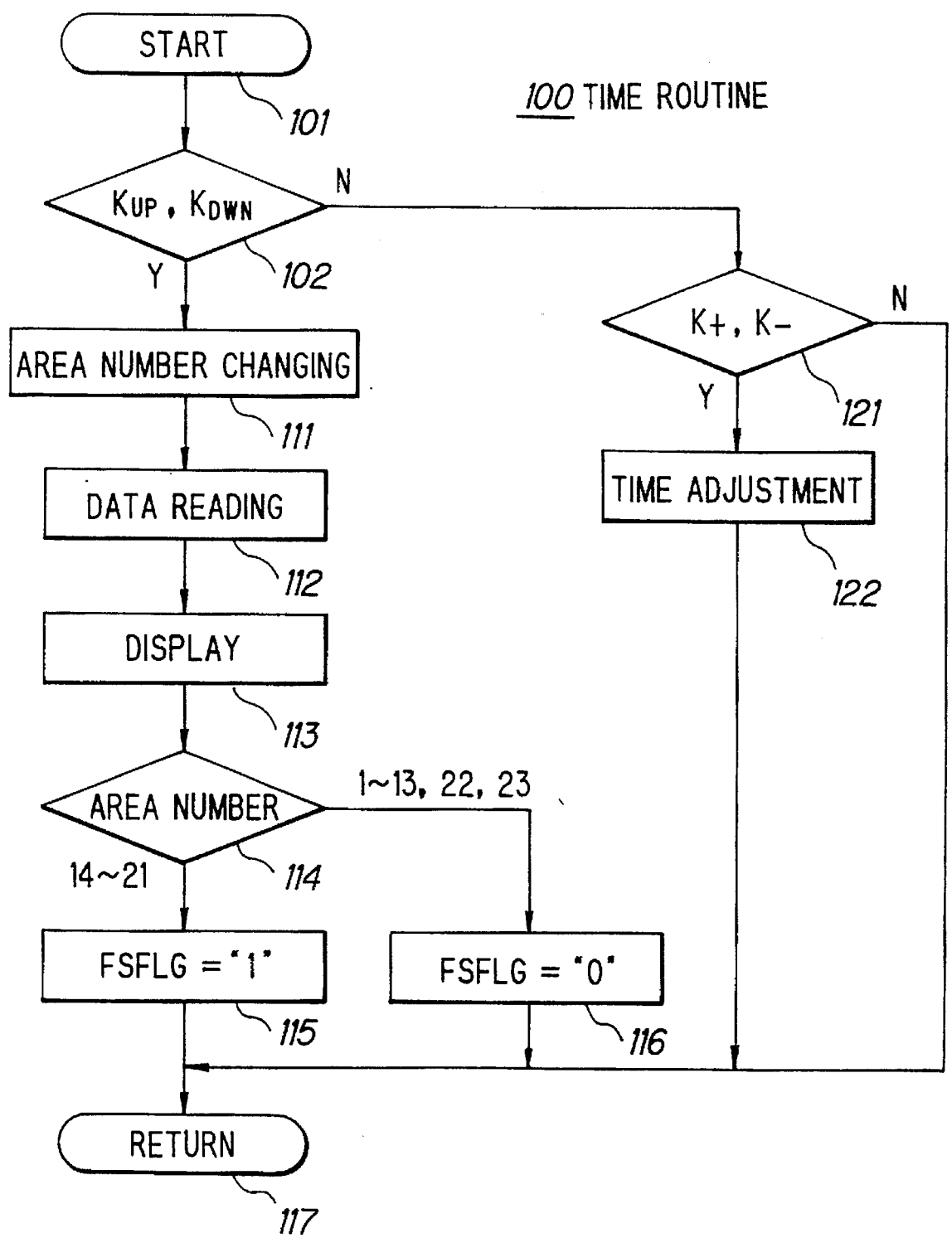
FIG. 3 is a flowchart showing an example of a first processing routine.
Figure 4:
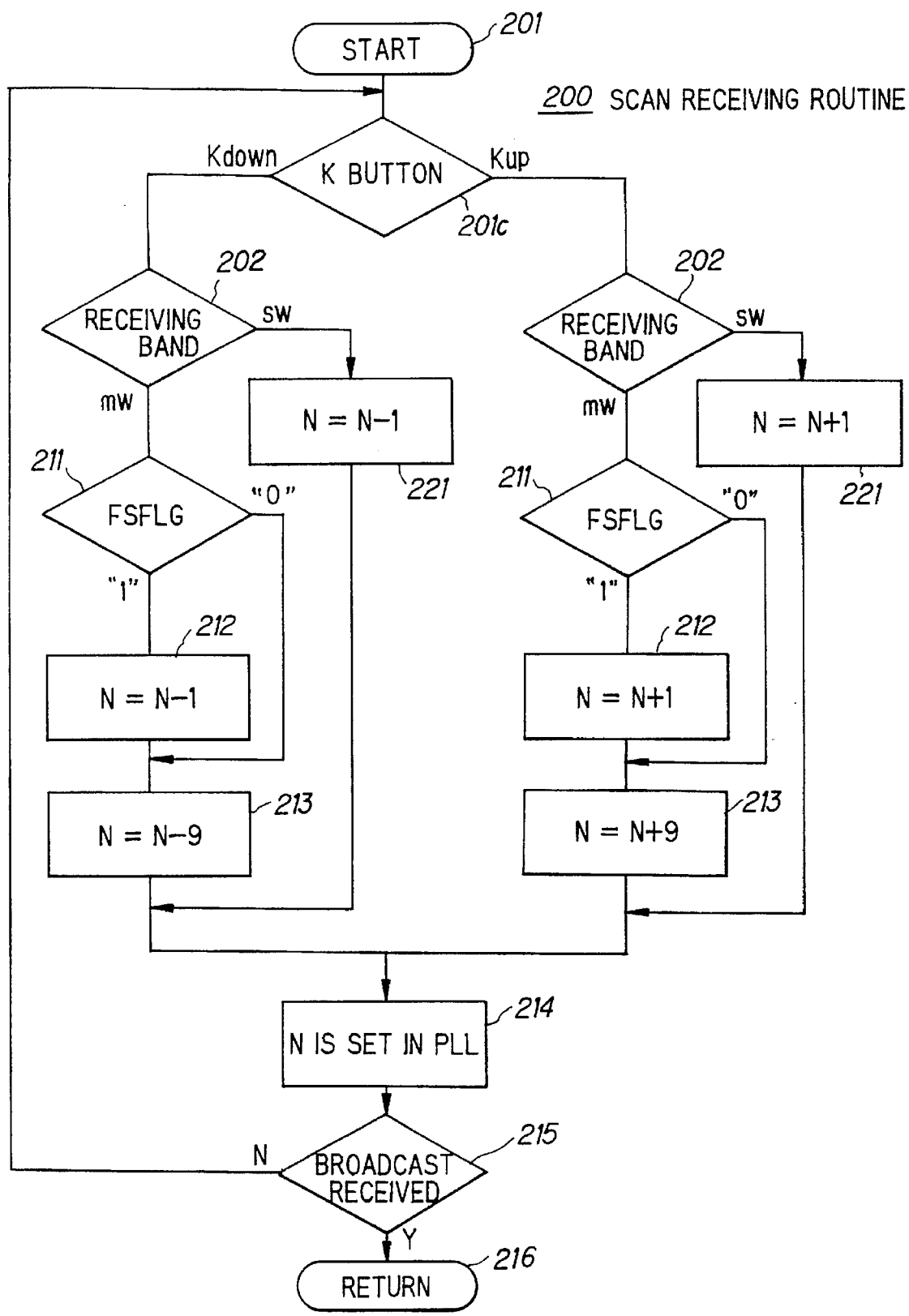
FIG. 4 is a flowchart showing an example of a second processing routine.
Figure 5:
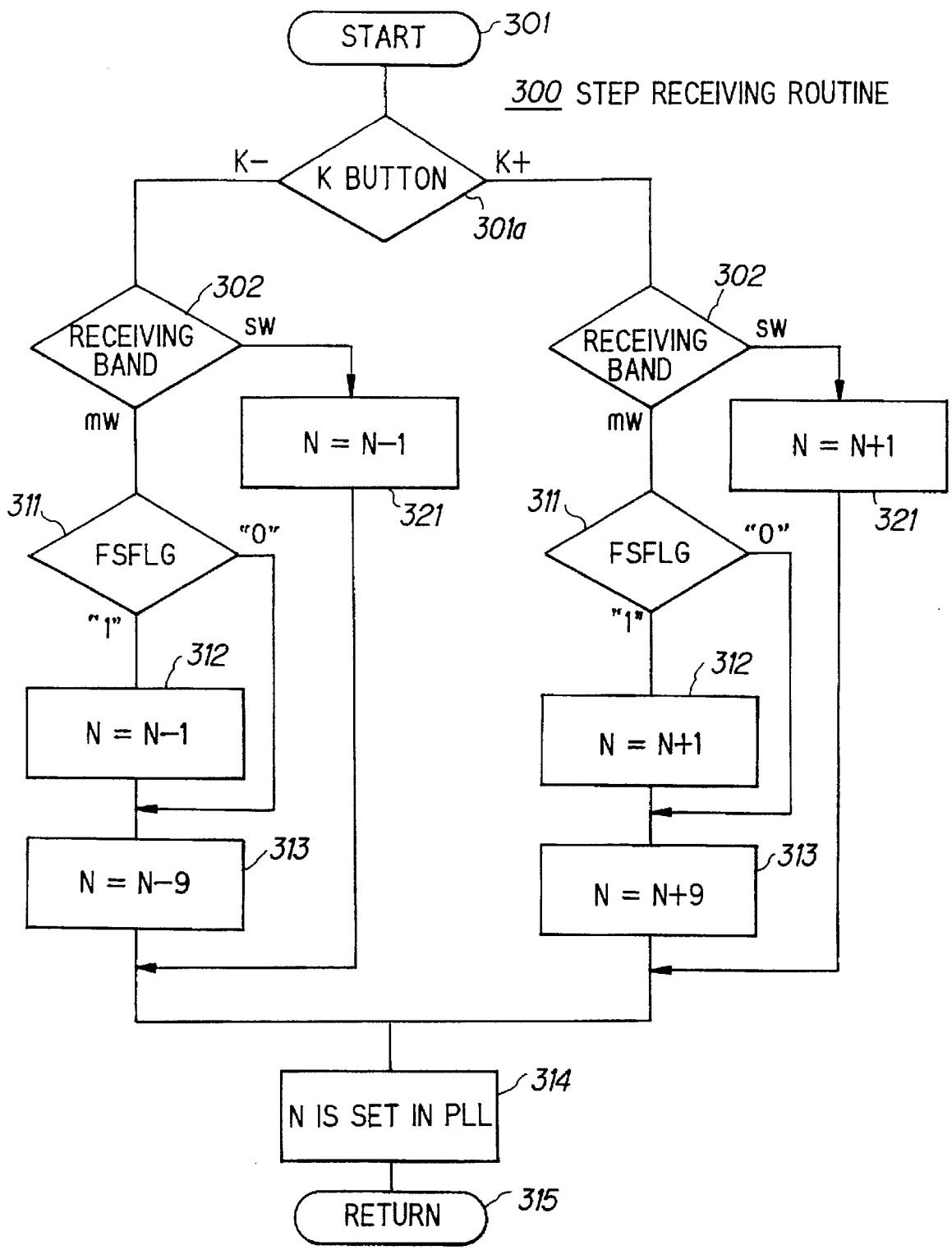
FIG. 5 is a flowchart showing an example of a third processing routine.

Returning to FIG. 1, a time routine 100, a scan receiving routine 200 and a step receiving routine 300 as shown in FIGS. 3-5 are prepared and stored in the ROM 32 as part of the processing routines. The memory 34 is for example, a ROM with which data erasure and writing can be performed electrically, or a RAM backed up by a battery (not shown). That is, the memory 34 is preferably a nonvolatile memory which can hold written data even after power-off.

For example, if the data TMDF (=+9) and PLCDT (=TOKYO) of area number 9 are currently used for display, the area number ARNO (=9) is stored in the memory 34 as data (pointer) indicating the row of current use. That is, the area number ARNO of the row of the table TDTBL whose data TMDF and PLCDT are now being used is stored in the memory 34 as data (pointer) indicating that the row is in current use.

In FIG. 1, an output port 41, an input port 42 and an input key interface 43 are connected to the CPU 31 via the system bus 39. The output port 41 is connected to the frequency dividing circuit 22, and the CPU 31 sets the dividing ratio N in the frequency dividing circuit 22 via the output port 41. A detection signal S51 that is output from a detection circuit 51 is supplied to the CPU 31 via the input port 42. Various operation keys $K_{TS}$ to $K_9$ act as an input device in the present invention and are connected to the key interface circuit 43. Each of the keys $K_{TS}$ to $K_9$ is for example, a non-lock type push switch. It will be recognized by those skilled in the art that the input device of the present invention can take many other alternate forms without departing from the scope of the claimed invention.

A clock circuit 44, which keeps time (UTC time, for instance), is also connected to the CPU 31 via the system bus 39. A display 52, i.e., a LCD in this embodiment, displays digitally the receiving frequency and current time. The LCD 52 is connected to the system bus via a display controller 45, and a memory 46 as a buffer of display data is connected to the controller 45.

Figure 6:
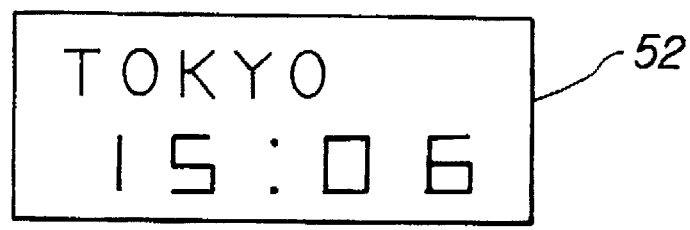
FIG. 6 shows a display example.

Display data written in the memory 46 is supplied to the LCD 52 while being repeatedly read out by the controller 45 at a predetermined period, and the time, a receiving frequency, etc. that correspond to the display data written in the memory 46 are digitally displayed on the LCD 52. In this embodiment, when a power switch (not shown) is off, the power of the receiving circuit 10 is off and the LCD 52 displays a place name and local time of the corresponding area as shown in FIG. 6. When the power switch is on, the power of the receiving circuit is on, and broadcast reception is performed and the LCD 52 displays a receiving frequency etc.

With the above configuration, each processing or operation is performed as exemplified below.

The time display operation is performed when the power switch is off. The CPU 31 receives an interrupt request from the clock circuit 44 every one minute, for example. In response, the CPU 31 reads, from the clock circuit 44, data of UTC time that is kept by the clock circuit 44. Then, referring to the time difference table TDTBL, the CPU 31 reads time difference data TMDF and place name data PLCDT from a row of the time difference table TDTBL corresponding to an area number ARNO (data indicating a row in which the time difference data TMDF currently used for display is written) which is stored in the memory 34.

The CPU 31 corrects or converts the data of UTC time that has been read from the clock circuit 44 into time data of local time using the time difference data TMDF thus read. Then, the CPU 31 supplies the data of local time to the display controller 45 after converting it to display data, and also writes it to the memory 46. Further, the CPU 31 supplies the readout place name data PLCDT to the controller 45 after converting it to display data, and also writes it to the memory 46.

Thus, the LCD 52 displays the place name and the local time of the corresponding area as shown in FIG. 6.

The display of local time of each area is effected by pushing an up key $K_{UP}$ or a down key $K_{DWN}$ while depressing a time set key $K_{TS}$ among the operation keys $K_{TS}$ to $K_9$.

When the time set key $K_{TS}$ is depressed, the time routine 100 of the processing routines of the CPU 31 is started from step 101. In step 102, it is checked whether the key $K_{UP}$ or $K_{DWN}$ (and $K_{TS}$) is depressed. Since either key is depressed in this case, the process goes to step 111.

In step 111, the area number ARNO of the time difference table TDTBL that is stored in the memory 34 is incremented or decremented by one depending on whether the key $K_{UP}$ or $K_{DWN}$ is depressed. If the incremented result exceeds the maximum value 23 of the area number ARNO, it is replaced by, or cycled to, the minimum value 0. If the decremented result is smaller than the minimum value 0 of the area number ARNO, it is replaced by, or cycled to the maximum value 23.

Then, in step 112, time difference data TMDF and place name data PLCDT are read out from the row corresponding to the area number ARNO that was set in step 111. In step 113, the data of current UTC time is read out from the clock circuit 44, and corrected, or converted, to local time using the time difference data TMDF that was read in step 112. The corrected local time data is written to the memory 46 via the controller 45 after being converted to display data. Further, the place name data PLCDT that was read in step 112 is also written to the memory 46 via the controller 45 after being converted to display data.

As a result, the place name and its local time that are located before or after those of the previous display on the time difference table TDTBL are now displayed on the LCD 52.

Then, in step 114, it is checked whether the area number ARNO obtained by incrementing or decrementing in step 111 belongs to the group of area numbers that corresponds to the frequency interval of 10 kHz, i.e., whether it corresponds to ARNO 14–21. If the judgment is affirmative, the process goes from step 114 to step 115, where a frequency interval flag FSFLG of the memory 34 is set at 1. Then, the process goes to step 117 to finish the execution of the routine 100.

If the area number ARNO is not within ARNO 14–21, the process goes from step 114 to step 116, where the frequency interval flag FSFLG is set at 0. Then, the process goes to step 117 to finish the execution of the routine 100. Every time the key $K_{UP}$ or $K_{DWN}$ is pushed while the time set key $K_{TS}$ is depressed, steps 102–116 are performed, so that the place name and the local time of the area of the place name are displayed on the LCD 52 based on the place name data PLCDT and the time difference data TMDF of the time difference table TDTBL in which the place name data PLCDT and the time difference data TMDF of current use moves upward or downward on the time difference table TDTBL.

Thus, with the key operations described above, one of the place names stored in the time difference table TDTBL and local time of the area of that place name can be selected and displayed on the LCD 52. When the intended place name is displayed on the LCD 52, the time difference of the area of that place name is automatically set and the displayed local time can be adjusted to the local time of that area.

In the above operation, the frequency interval flag FSFLG is set at 1 (for the frequency interval of 10 kHz) or 0 (for 9 kHz) in accordance with the displayed place name. The operation of time correction, or conversion, is effected by pushing a key $K^+$ or $K^-$ while depressing the time set key $K_{TS}$ among the operation keys $K_{TS}$ to $K_9$ and is described in FIG. 3.

When the time set key $K_{TS}$ is depressed, the routine 100 of the processing routines of the CPU 31 is started from step 101 as in the case of the operation of "display of local time of each area." In step 102, it is checked whether the key $K_{UP}$ or $K_{DWN}$ (and $K_{TS}$) is depressed. Since neither keys are depressed in this case, the process goes to step 121.

In step 121, it is checked whether the key $K^+$ or $K^-$ (and $K_{TS}$) is depressed. If either key is depressed in this case, the process goes from step 121 to step 122, where the UTC time(reference time) that is kept by the clock circuit 44 is incremented or decremented by one (hour) depending on whether the key $K^+$ or $K^-$ is depressed. Then, the process goes to step 117 to finish the execution of the routine 100.

In the above manner, the UTC time ( reference ) can be corrected by pushing the key $K^+$ or $K^-$ while depressing the time set key $K_{TS}$. As a result, the local time can also be corrected.

When none of the keys $K_{UP}$, $K_{DWN}$, $K^+$ and $K^-$ are pushed even if the time set key $K_{TS}$ is depressed, the process goes from step 121 to step 117 to finish the execution of the routine 100 (no actual operation is performed).

With reference to FIG. 4, Scan reception of medium frequency broadcast is effected by pushing the up key $K_{UP}$ or down key $K_{DWN}$ without depressing the time set key $K_{TS}$.

When the key $K_{UP}$ or $K_{DWN}$ is depressed, the scan reception routine 200 of the processing routines of the CPU 31 is started from step 201. In step 202, it is judged, for instance, by checking the frequency dividing ratio N whether the current receiving band is a medium frequency band or a short wave band. If the current receiving band is a medium frequency band, the process goes from step 202 to step 211, where the frequency interval flag FSFLG is checked.

If FSFLG is 1, the process goes from step 211 to step 212, where the frequency dividing ratio N is incremented or decremented by 1 depending on whether the key $K_{UP}$ or $K_{DWN}$ is depressed. Then, the process goes to step 213, where the frequency dividing ratio N is incremented or decremented by 9. Then, the process goes to step 214. Therefore, if FSFLG is 1, the frequency dividing ratio N is incremented or decremented by 10 depending on whether the key $K_{UP}$ or $K_{DWN}$ is depressed.

If FSFLG is 0 in step 211, the process goes from step 211 to step 213, where the frequency dividing ratio N is incremented or decremented by 9 depending on whether the key $K_{UP}$ or $K_{DWN}$ is depressed in step 201c. Then, the process goes to step 214. If the value obtained by incrementing or decrementing in step 213 is larger than the maximum value 30,450 of the frequency dividing ratio N, it is replaced by the minimum value. If it is smaller than the minimum value 980, it is replaced by the maximum value.

In step 214, the frequency ratio N as updated in step 213 is set in the frequency dividing circuit 22 via the port 41. The receiving frequency f12 increases or decreases at steps of 10 kHz when FSFLG is 1, and at steps of 9 kHz when FSFLG is 0.

Then, the process goes to step 215, where it is judged by checking the detection signal S51 whether a broadcast is being received. If the judgment is negative, the process returns from step 215 to step 202. If the judgment in step 215 is affirmative, the process goes from step 215 to step 216 to finish the execution of the routine 200.

Therefore, steps 202-215 are repeatedly performed until a broadcast is received, while the receiving frequency f12 is varied at steps of 10 kHz or 9 kHz. In other words, scan reception is performed.

The frequency steps of the scanning are 10 kHz when FSFLG is 1, which corresponds to the cases where ARNO is between 14 and 21 on the time difference table TDTBL. On the other hand, the frequency steps of the scanning are 9 kHz when FSFLG is 0, which corresponds to the cases where ARNO is not larger than 13 or not smaller than 22 on the time difference table TDTBL.

With the above operation, in any area, the step of receiving frequencies f12 of the scanning correctly corresponds to the frequency interval of broadcast signals. Further, the step of receiving frequencies f12 is automatically set; that is, a user need not set it.

Scan reception of short wave broadcast is also effected by pushing the up key $K_{UP}$ or down key $K_{DWN}$ without depressing the time set key $K_{TS}$.

With reference to FIG. 4, when the key $K_{UP}$ or $K_{DWN}$ is depressed, the routine 200 of the processing routines of the CPU 31 is started in the same manner as in the scan reception of a medium frequency broadcast. In step 202, it is judged whether the current receiving band is a medium frequency band or a short wave band. If the current receiving band is a short wave band, the process goes from step 202 to step 221, where the frequency dividing ratio N is incremented or decremented by 1 depending on whether the key $K_{UP}$ or $K_{DWN}$ is depressed. Then, the process goes to step 214.

During the broadcast reception of a short wave band, since the frequency dividing ratio N is varied at steps of 1, the receiving frequency f12 varies at steps of 1 kHz. Upon reception of a broadcast, the receiving state of that broadcast is maintained thereafter. Thus, scan reception is performed.

Step reception of medium frequency broadcast is effected by pushing the key $K^+$ or key $K^-$ without depressing the time set key $K_{TS}$.

With reference to FIG. 5, when the key $K^+$ or $K^-$ is depressed, the scan reception routine 300 of the processing routines of the CPU 31 is started from step 301. In step 302, it is judged, for instance, by checking the frequency dividing ratio N whether the current receiving band is a medium frequency band or a short wave band. If the current receiving band is a medium frequency band, the process goes from step 302 to step 311, where the frequency interval flag FSFLG is checked.

If FSFLG is 1, the process goes from step 311 to step 312, where the frequency dividing ratio N is incremented or decremented by 1 depending on whether the key $K^+$ or $K^-$ is depressed in step 301a. Then, the process goes to step 313, where the frequency dividing ratio N is incremented or decremented by 9. Then, the process goes to step 314. Therefore, if FSFLG is 1, the frequency dividing ratio N is incremented or decremented by 10 depending on whether the key $K^+$ or $K^-$ is depressed in step 301a.

If FSFLG is 0 in step 311, the process goes from step 311 to step 313, where the frequency dividing ratio N is incremented or decremented by 9 depending on whether the key $K^+$ or $K^-$ is depressed in step 301a. Then, the process goes to step 314. If the value obtained by incrementing or decrementing in step 313 is larger than the maximum value 30,450 of the frequency dividing ratio N, it is replaced by the minimum value. If it is smaller than the minimum value 980, it is replaced by the maximum value.

In step 314, the frequency ratio N as updated in step 313 is set in the frequency dividing circuit 22 via the port 41. The receiving frequency f12 increases or decreases at steps of 10 kHz when FSFLG is 1, and at steps of 9 kHz when FSFLG is 0. Then, the process goes to step 315, to finish the execution of the routine 300.

In the above manner, the receiving frequency f12 is varied at steps of 10 kHz or 9 kHz. In other words, step reception is performed.

The frequency steps are 10 kHz when FSFLG is 1, which corresponds to the cases where ARNO is between 14 and 21 on the time difference table TDTBL. On the other hand, the frequency steps are 9 kHz when FSFLG is 0, which corresponds to the cases where ARNO is not larger than 13 or not smaller than 22 on the time difference table TDTBL.

With the above operation, in any area, the step of receiving frequencies f12 of the step reception correctly corresponds to the frequency interval of broadcast signals. Further, the step of receiving frequencies f12 is automatically set; that is, a user need not set it.

Step reception of short wave broadcast is effected by pushing the key $K^+$ or $K^-$ without depressing the time set key $K_{TS}$.

When the key $K^+$ or $K^-$ is depressed, the routine 300 of the processing routines of the CPU 31 is started in the same manner as in the step reception of a medium frequency broadcast. In step 302, it is judged whether the current receiving band is a medium frequency band or a short wave band. If the current receiving band is a short wave band, the process goes from step 302 to step 321, where the frequency dividing ratio N is incremented or decremented by 1 depending on whether the key $K^+$ or $K^-$ is depressed. Then, the process goes to step 314.

During the broadcast reception of a short wave band, since the frequency dividing ratio N is varied at steps of 1 every time the key $K^+$ or $K^-$ is depressed, the receiving frequency f12 varies at steps of 1 kHz. That is, scan reception is performed.

Direct station selection is effected by directly designating a number that indicates a receiving frequency f12 using the numeral keys $K_0$ to $K_9$ among the operation keys $K_{TS}$ to $K_9$. In this operation, among the operation keys $K_{TS}$ to $K_9$, first a direct key $K_{DRCT}$ is depressed, then the numeral keys $K_0$ to $K_9$ are depressed in accordance with a number that indicates a receiving frequency f12, and finally an execution key $K_{EXE}$ is depressed. As a result, a frequency dividing ratio N corresponding to the receiving frequency f12 of the number as input by using the numeral keys $K_0$ to $K_9$ is calculated and set in the frequency dividing circuit 22. Therefore, the frequency f12 that has been input by using the numeral keys $K_0$ to $K_9$ is selected.

To preset arbitrary receiving frequencies f12 for the numeral keys $K_0$ to $K_9$ the station selection is performed by one of the above-described methods. Then, an arbitrary one $K_i$ (i=0 to 9) of the numeral keys $K_0$ to $K_9$ is pushed while a registration key $K_{REG}$ is depressed. As a result, a frequency dividing ratio N of a frequency f12 being received is written to an area $A_i$ of the memory 34 that corresponds to the depressed numeral key $K_i$. Thus, arbitrary receiving frequencies f12 can be preset for the numeral keys $K_0$ to $K_9$.

To select a frequency f12 that is preset for the numeral keys $K_0$ to $K_9$, an arbitrary one Ki of the numeral keys $K_0$ to $K_9$ is depressed. In response, a frequency dividing ratio N is read out from an area $A_i$ of the memory 34, and set in the frequency dividing circuit 22. Thus, by depressing the numeral key $K_i$, the frequency f12 that is preset for the depressed numeral key $K_i$ is selected.

In the above embodiment, the frequency interval flag FSFLG is set or reset at 1 or 0 in accordance with the area number ARNO in steps 114–116. Alternatively, the frequency interval flag FSFLG may set or reset at 1 or 0 in accordance with the time difference data TMDF or place name data PLCDT.

In the operation of "time display" of the above embodiment, referring to the time difference table TDTBL, time difference data TMDF and place name data PLCDT are read from a row of the time difference table TDTBL corresponding to an area number ARNO stored in the memory 34. And the data of UTC time that has been read from the clock circuit 44 is corrected into time data of local time using the time difference data TMDF thus read, and used for display. Alternatively, the time difference data TMDT and place name data PLCDT read from the time difference table TDTBL may be stored in the memory 34. And the data of UTC time that has been read from the clock circuit 44 may be corrected into time data of local time using the time difference data TMDT stored in the memory 34, and used for display.

In the time difference table TDTBL of FIG. 2, Tahiti is listed in the row of a time difference −10 hours. Although Tahiti has a time difference of −10 hours, the frequency interval of broadcast signals is 9 kHz there. To accommodate areas where a relationship between the time difference and the frequency interval does not fit the time difference table TDTBL, the table may be provided with rows having the same time difference data TMDF but different place name data PLCDT. To accommodate Tahiti or the like, the following modification may be made: the respective area numbers ARNO of 14 onward are increased by 1; the row of area number 14 is given TMDF of −10 and PLCDT of TAHITI; and the variation step of the frequency dividing ratio N is made 10 for area numbers 15–22 and 9 for the other area numbers.

According to the invention, when a displayed place name is selected, the time difference of local time is corrected by use of the time difference table TDTBL. In association with this correction, the interval of receiving frequencies f12 is set at 9 kHz or 10 kHz. Therefore, the interval of receiving frequencies f12 can coincide with the frequency interval of broadcast signal of an area concerned.

Since the interval of receiving frequencies f12 can be automatically set at a correct value only by setting displayed local time, a cumbersome operation of setting the frequency interval can be eliminated. Further, a user need not know whether the frequency interval of a particular area is 9 kHz or 10 kHz.

In addition, when shipping receivers, a maker need not set a frequency interval for each destination. This will contribute to reduction in the numbers of assembling steps and setting errors.

While there has been described and illustrated a preferred embodiment of the present invention, it will be apparent to those skilled in the art that various changes and modifications to the present invention can be made with out departing from the scope and spirit of the claimed invention. It is intended in the appended claims to cover all such changes and modifications as fall within the true spirit and scope of the present invention without departing from the scope of the claims appended hereto.

What is claimed is:

1. A synthesizer receiver having a clock circuit for keeping a reference time, a display for displaying a local time for a local area having a predetermined time difference relationship to the reference time kept by the clock circuit, and a PLL in which a receiving signal is frequency-converted based on an output signal of the PLL, and a receiving frequency is changed by changing a frequency dividing ratio of a variable frequency dividing circuit of the PLL, comprising:

a table for storing data of names of areas, data of respective time differences between respective local times of the areas and the reference time, and data of respective frequency intervals, each area having a corresponding frequency interval to be added/subtracted from a first receiving frequency to effect a change to a second receiving frequency adjacent to the first receiving frequency, wherein the local time displayed on the display is determined by adding a time difference of the local area which is stored in the table to the reference time, and a variation amount of the frequency dividing ratio is set in accordance with a frequency interval corresponding to the local area.

2. A synthesizer radio receiver comprising:

a tuner for receiving a plurality of reception frequencies;

a clock circuit for maintaining a reference time;

storage means for storing location data of a plurality of geographical regions, interval data of frequency intervals corresponding to said plurality of respective geographical regions, and time difference data of differences in time between respective local times of said plurality of respective geographical regions and said reference time maintained by said clock circuit;

user input means for supplying control data corresponding to one of said plurality of geographical regions;

controller for retrieving frequency interval data and time difference data corresponding to said one of said plurality of geographical regions which is specified by said control data, from said storage means, said controller including means for controlling said tuner to receive one of said plurality of reception frequencies, said means controlling said tuner to receive a second one of said plurality of reception frequencies which is adjacent to said one of said plurality of reception frequencies by adding/subtracting a frequency interval corresponding to said frequency interval data retrieved from said storage means, and means for determining a local time of said one of said plurality of geographical regions based upon said reference time and said time difference data retrieved from said storage means; and display means for displaying time information including said local time.

3. A synthesizer radio receiver comprising:

a tuner for receiving a plurality of reception frequencies, adjacent reception frequencies being separated by a frequency interval;

a clock circuit for maintaining a reference time;

storage means for storing location data of a plurality of geographical regions, interval data of frequency intervals corresponding to said plurality of respective geographical regions, and time difference data of differences in time between respective local times of said plurality of respective geographical regions and said reference time maintained by said clock circuit;

user input means for supplying control data corresponding to one of said plurality of geographical regions;

controller for retrieving frequency interval data and time difference data corresponding to said one of said plurality of geographical regions which is specified by said control data, from said storage means, said controller including means for controlling said tuner to selectably vary said frequency interval of said tuner to correspond to said frequency interval data of said one of said plurality of geographical regions which is retrieved from said storage means, means for determining a local time of said one of said plurality of geographical regions based upon said reference time and said time difference data retrieved from said storage means; and display means for displaying time information including said local time.

4. A synthesizer radio receiver according to claim 2 wherein said user input means further comprises means for inputting a control signal to cause a next successive higher reception frequency to be tuned in by said tuner.

5. A synthesizer radio receiver according to claim 2 wherein said user input means further comprises means for inputting a control signal to cause a next successive lower reception frequency to be tuned in by said tuner.

6. A synthesizer radio receiver according to claim 2 wherein said user input means comprises a plurality of user actuable switches.

7. A synthesizer radio receiver according to claim 2 wherein said display means further comprises means for displaying reception frequency information.

8. A synthesizer radio receiver according to claim 2 wherein said tuner comprises a phase locked loop circuit.

9. A synthesizer radio receiver according to claim 2 wherein said tuner further comprises a variable frequency dividing circuit for establishing a frequency dividing ratio in accordance with a frequency interval; and said controller further comprises means for selectably varying said frequency dividing ratio in accordance with said frequency interval data retrieved from said storage means.

10. A synthesizer radio receiver comprising:

a tuner for receiving a plurality of reception frequencies, said tuner including a variable frequency dividing circuit for establishing a frequency dividing ratio in accordance with a frequency interval;

a clock circuit for maintaining a reference time;

storage memory for storing location data of a plurality of geographical regions, interval data of frequency intervals corresponding to said plurality of respective geographical regions, and time difference data of differences in time between respective local times of said respective geographical regions and said reference time maintained by said clock circuit;

user input means for supplying control data corresponding to one of said plurality of geographical regions, said user input means including a plurality of user actuable switches;

controller for retrieving frequency interval data and time difference data corresponding to said one of said plurality of geographical regions which is specified by said control data, from said storage means, said controller including means for supplying said frequency interval data retrieved from said storage means to said variable frequency dividing circuit to cause said frequency dividing ratio of said variable frequency dividing circuit to be selectably varied in accordance with said interval data retrieved from said storage means and to cause said reception frequencies which are received by said tuner to be separated by a frequency interval corresponding to said frequency interval data retrieved from said storage means, and means for determining a local time at said one of said plurality of geographical regions based upon said reference time and said time difference data retrieved from said storage means; and display means for displaying reception frequency information and time information including said local time.

11. In a synthesizer radio receiver, a method of tuning in reception frequencies comprising the steps of:

inputting control data corresponding to one of a plurality of geographical region;

retrieving frequency interval data associated with said one of said plurality of geographical regions which corresponds to one of a plurality of frequency intervals of respective geographical regions which are stored in a storage memory;

retrieving time difference data associated with said one of said plurality of geographical regions which corresponds to a time difference between a local time of said one of a plurality of geographical regions and a reference time, from said storage memory; and tuning in a reception frequency based upon said frequency interval data retrieved from said storage memory.

* * * * *